(12) United States Patent
Sun

(10) Patent No.: US 9,589,825 B2
(45) Date of Patent: Mar. 7, 2017

(54) GLASS SUBSTRATE TRANSFER SYSTEM AND ROBOT ARM THEREOF

(71) Applicant: Shenzhen China Star Optoelectronics Technology Co., Ltd., Shenzhen, Guangdong (CN)

(72) Inventor: Shih Ying Sun, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 204 days.

(21) Appl. No.: 14/396,038

(22) PCT Filed: Sep. 22, 2014

(86) PCT No.: PCT/CN2014/087032
§ 371 (c)(1),
(2) Date: Oct. 21, 2014

(87) PCT Pub. No.: WO2016/037383
PCT Pub. Date: Mar. 17, 2016

(65) Prior Publication Data
US 2016/0068426 A1    Mar. 10, 2016

(30) Foreign Application Priority Data
Sep. 10, 2014  (CN) .................. 2014 1 04595336

(51) Int. Cl.
*H01L 21/683* (2006.01)
*C03B 35/20* (2006.01)
(Continued)

(52) U.S. Cl.
CPC ........ *H01L 21/6838* (2013.01); *C03B 35/202* (2013.01); *C03B 35/207* (2013.01);
(Continued)

(58) Field of Classification Search
CPC ..... C03B 35/202; C03B 35/207; C03B 29/12; C23C 16/4583; F27D 3/0084;
(Continued)

(56) References Cited

U.S. PATENT DOCUMENTS 5,765,889 A * 6/1998 Nam ................. B25J 15/0616
414/752.1
6,298,684 B1 * 10/2001 Mitsuyoshi .......... B23Q 11/128
414/939
(Continued)

FOREIGN PATENT DOCUMENTS

| CN | 1939675 A | 4/2007 |
|---|---|---|
| CN | 101490835 A | 7/2009 |

(Continued)

*Primary Examiner* — Glenn Myers
(74) *Attorney, Agent, or Firm* — Andrew C. Cheng

(57) ABSTRACT

A glass substrate transfer system and a robot arm thereof are provided. The robot arm includes: a substrate fork, a moving assembly and a vacuum chuck. The substrate fork is for taking a glass substrate. The moving assembly is connected with the substrate fork and for making the substrate fork to be moved in a working space. The vacuum chuck is disposed on the substrate fork and for sucking the glass substrate. The vacuum chuck is formed with a fluid path, and the fluid path is contained with a cooling fluid to dissipate heat of the vacuum chuck. The glass substrate transfer system and its robot arm provided by the present invention cool the vacuum chuck in time and thus can avoid affecting the product quality caused by the vacuum chuck being overheated, and the product yield is improved.

12 Claims, 5 Drawing Sheets

(51) Int. Cl.
*H01L 21/687* (2006.01)
*F27D 3/00* (2006.01)

(52) U.S. Cl.
CPC .......... *H01L 21/68707* (2013.01); *F27D 2003/0001* (2013.01); *F27D 2003/0046* (2013.01); *F27D 2003/0051* (2013.01); *Y02P 40/57* (2015.11); *Y10S 901/40* (2013.01)

(58) Field of Classification Search
CPC .... F27D 3/0024; F27D 3/0021; F27D 3/0022; F27D 2003/0001; F27D 2003/0046; F27D 2003/0051; H01L 21/68707; H01L 21/6838; B23F 23/04; B25J 15/0616; B25J 15/0014; C21B 7/20; F27B 1/20
See application file for complete search history.

(56) References Cited

U.S. PATENT DOCUMENTS

| | | | | |
|---|---|---|---|---|
| 6,499,777 | B1 * | 12/2002 | Wang | C30B 35/005 |
| | | | | 118/728 |
| 9,209,014 | B2 * | 12/2015 | Rathsack | H01L 21/02269 |
| 2003/0032322 | A1 * | 2/2003 | Nakamura | H01L 23/4093 |
| | | | | 439/330 |
| 2007/0218706 | A1 * | 9/2007 | Matsuoka | F27B 5/04 |
| | | | | 438/781 |
| 2008/0185370 | A1 * | 8/2008 | Fukuoka | F27B 17/0025 |
| | | | | 219/385 |

FOREIGN PATENT DOCUMENTS

| | | |
|---|---|---|
| CN | 101678968 A | 3/2010 |
| CN | 102730416 A | 10/2012 |
| CN | 1543673 A | 11/2014 |
| JP | 2002346965 A * | 12/2002 |
| JP | 2002346965 A | 12/2002 |

* cited by examiner

GLASS SUBSTRATE TRANSFER SYSTEM AND ROBOT ARM THEREOF

TECHNICAL FIELD

The present invention relates to the field of liquid crystal display manufacturing technology, and particularly to a robot arm and a glass substrate transfer system.

DESCRIPTION OF RELATED ART

The LCD production line generally is equipped with a robot arm, and the robot arm needs to move back and forth between a high-temperature furnace and other process machine. The robot arm would be easily heated when works in the high-temperature furnace and thereby the temperature thereof is increased, if at this time the robot arm goes immediately to the other process machine for operation, the high temperature of the robot arm may affect the product quality, for example resulting in uneven brightness of a glass substrate and a variety of marks formed on the glass substrate.

Please refer to FIG. 1, FIG. 1 is a working schematic view of a robot arm in a high-temperature furnace.

An internal temperature of the high-temperature furnace 310 is high, the robot arm 100 moves into the high-temperature furnace 310 for working and the temperature thereof is gradually increased over time.

Please further refer to FIGS. 2 and 3, FIG. 2 is a working schematic view of the robot arm transferring a glass substrate, and FIG. 3 is a schematic side view of the robot arm as shown in FIG. 2.

In most cases, after the robot arm 100 moves out from the high-temperature furnace 310, typically the robot arm 310 has not cooled yet but goes on the transferring of the glass substrate 200. At this time, vacuum chucks of the robot arm 100 would transfer the high temperature to the glass substrate 200, defects are generated on the glass substrate 200, and the product quality is affected consequently.

SUMMARY

Accordingly, the present invention provides a glass substrate transfer system and a robot arm thereof, so as to solve the problems of defects being generated on the glass substrate by the robot arm and product quality being affected.

In order to solve the above technical problem, a technical solution proposed by the present invention is to provide a robot arm. The robot arm includes: a substrate fork configured (i.e., structured and arranged) for taking a glass substrate; a moving assembly connected with the substrate fork and configured for making the substrate fork to be moved in a working space; a vacuum chuck disposed on the substrate fork and configured for sucking the glass substrate, wherein the vacuum chuck is formed with a fluid path, the fluid path is contained with a cooling fluid to dissipate heat of the vacuum chuck, and the vacuum chuck has one ring-structure or concentrically arranged multiple ring-structures; and a heat-dissipating assembly disposed at a side of the substrate fork, the moving assembly or the vacuum chuck and configured for being moved to above the vacuum chuck to dissipate heat of the vacuum chuck when the vacuum chuck is heated and does not suck the glass substrate.

In order to solve the above technical problem, another technical solution proposed by the present invention is to provide a robot arm. The robot arm includes: a substrate fork configured for taking a glass substrate; a moving assembly connected with the substrate fork and configured for making the substrate fork to be moved in a working space; a vacuum chuck disposed on the substrate fork and configured for sucking the glass substrate, wherein the vacuum chuck is formed with a fluid path, the fluid path is contained with a cooling fluid to dissipate heat of the vacuum chuck.

According to a preferred embodiment of the present invention, the vacuum chuck has one ring-structure.

According to a preferred embodiment of the present invention, the vacuum chuck has concentrically arranged multiple ring-structures.

According to a preferred embodiment of the present invention, the fluid path is disposed at the interior of the ring-structures.

According to a preferred embodiment of the present invention, the fluid path is disposed between the ring-structures.

According to a preferred embodiment of the present invention, the robot arm further includes a heat-dissipating assembly. The heat-dissipating assembly is disposed at a side of the substrate fork, the moving assembly or the vacuum chuck and configured for being moved to above the vacuum chuck to dissipate heat of the vacuum chuck when the vacuum chuck is heated and does not suck the glass substrate.

According to a preferred embodiment of the present invention, the heat-dissipating assembly includes a gas nozzle, a pipe and a pump sequentially connected in that order, the gas nozzle being configured for spraying ambient-temperature clean gas or low-temperature clean gas onto the vacuum chuck.

According to a preferred embodiment of the present invention, the number of the gas nozzle is one, and the one gas nozzle is configured for being moved to above the middle of the vacuum chuck and then spraying ambient-temperature clean gas or low-temperature clean gas onto the vacuum chuck.

According to a preferred embodiment of the present invention, the number of the gas nozzle is multiple, and the multiple gas nozzles are configured for being moved to surround the vacuum chuck and then spraying ambient-temperature clean gas or low-temperature clean gas onto the vacuum chuck.

In order to solve the above technical problem, still another technical solution proposed by the present invention is to provide a glass substrate transfer system. The glass substrate transfer system includes: a high-temperature furnace and another process machine; a substrate fork configured for taking a glass substrate; a moving assembly connected with the substrate fork and configured for making the substrate fork to be moved in a working space; and a vacuum chuck disposed on the substrate fork and configured for sucking the glass substrate. The vacuum chuck is formed with a fluid path, and the fluid path is contained with a cooling fluid to dissipate heat of the vacuum chuck.

According to a preferred embodiment of the present invention, the glass substrate transfer system further includes a heat-dissipating assembly. The heat-dissipating assembly is disposed at a side of the high-temperature furnace, the another process machine, the substrate fork, the moving assembly or the vacuum chuck and configured for being moved to above the vacuum chuck to dissipate heat of the vacuum chuck when the vacuum chuck is heated and does not suck the glass substrate.

Beneficial effects can be achieved by the present invention are that: compared with the prior art, the glass substrate transfer system and the robot arm thereof according to the present invention cool the vacuum chuck in time, and therefore can avoid affecting the product quality caused by the vacuum chuck being overheated, and the product yield is improved consequently.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below only are a part of embodiments of the present invention, but not all embodiments. Based on the described embodiments of the present invention, all other embodiments obtained by ordinary skill in the art without creative effort belong to the scope of protection of the present invention.

Figure 4:
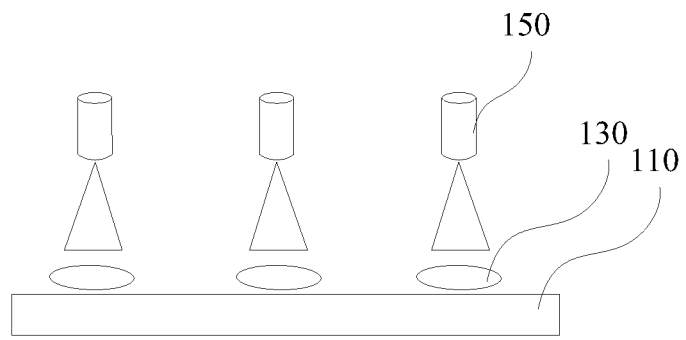
FIG. 4 is a simplified schematic structural view of a robot arm according to a preferred embodiment of the present invention.

Please further refer to FIG. 4, FIG. 4 is a simplified schematic structural view of a robot arm according to a preferred embodiment of the present invention.

The robot arm 100 provided by the present invention includes a substrate fork 110, a moving assembly 120 (refer to FIG. 1), vacuum chucks 130 and a heat-dissipating assembly 150.

The substrate fork 110 is configured (i.e., structured and arranged) for taking a glass substrate 200. The moving assembly 120 is connected with the moving assembly 120 and configured for making the substrate fork 110 to move in a working space. The vacuum chucks 130 each are disposed on the substrate fork 110 and configured for sucking the glass substrate 200. The heat-dissipating assembly 150 is disposed on a side of the substrate fork 110, the moving assembly 120 or the vacuum chucks 130 and configured for being moved to above the vacuum chucks 130 when the vacuum chucks 130 are heated and do not suck the glass substrate 200, so as to dissipate heat of the vacuum chucks 130.

The heat-dissipating assembly 150 includes a gas nozzle, a pipe and a pump sequentially connected in that order. The gas nozzle is configured for spraying ambient-temperature clean gas or low-temperature clean gas onto corresponding vacuum chuck 130.

In an embodiment, the number/amount of the gas nozzle is one, and the one gas nozzle moves to above the middle of corresponding vacuum chuck 130 and then sprays ambient-temperature clean gas or low-temperature clean gas onto the corresponding vacuum chuck 130.

In an alternative embodiment, the number/amount of the gas nozzle is multiple (i.e., more than one), and the multiple gas nozzles move to surround corresponding vacuum chuck 130 and then spray ambient-temperature clean gas or low-temperature clean gas onto the corresponding vacuum chuck 130.

Figure 5:
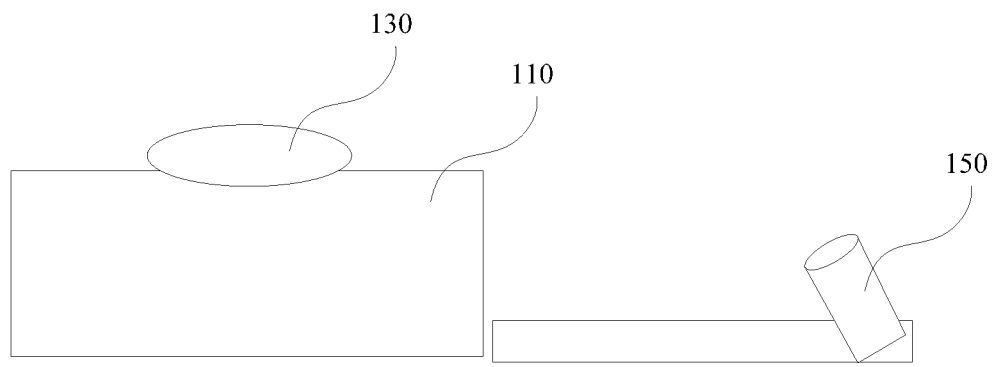
FIG. 5 is a schematic view of a working status of the robot arm as shown in FIG. 4.
Figure 6:
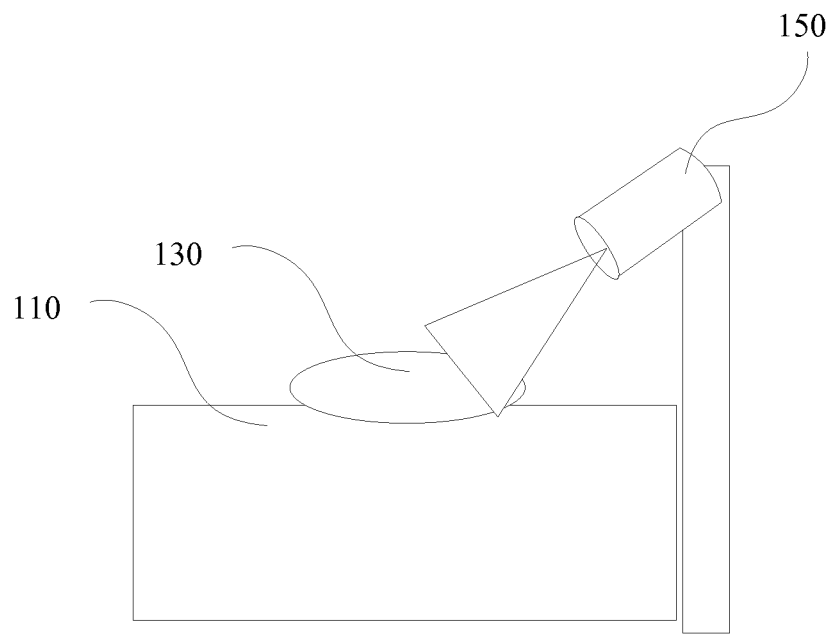
FIG. 6 is a schematic view of another working status of the robot arm as shown in FIG. 4.

Please further refer to FIGS. 5 and 6, FIGS. 5 and 6 respectively show two working statuses of the robot arm.

Normally, the heat-dissipating assembly 150 is located at a side of the robot arm 100. When the robot arm 100 is at the status of being moved out from the high-temperature furnace 310 and not sucking the glass substrate 200, the heat-dissipating assembly 150 is moved from the side of the robot arm 100 to above the vacuum chucks 130 so as to spray ambient-temperature clean gas or low-temperature clean gas onto the vacuum chucks 130.

Figure 7:
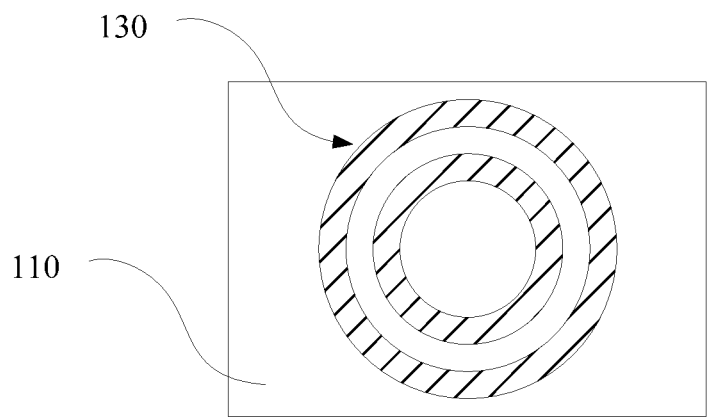
FIG. 7 is a partially enlarged schematic view of the robot arm as shown in FIG. 4.

Please further refer to FIG. 7, FIG. 7 is a partially enlarged schematic view of the robot arm as shown in FIG. 4.

The robot arm 100 has formed with multiple (i.e., more than one) vacuum chucks 130, each vacuum chuck 130 may be one ring-structure or concentrically arranged multiple ring-structures. FIG. 7 shows the vacuum chuck 130 being two ring-structures.

Furthermore, the vacuum chuck 130 in FIG. 7 is formed with a fluid path 140. The fluid path 140 is contained with a cooling fluid. The fluid path 140 is disposed at the interior of the ring-structures of the vacuum chuck 130 or disposed between the ring-structures, so as to dissipate heat of the vacuum chuck 130 in time.

Please refer to FIG. 1 and FIGS. 4 through 6, the present invention also provides a glass substrate transfer system 300. The glass substrate transfer system 300 includes a high-temperature furnace 310 and another process machine (not shown) and further includes the above-described robot arm 100. The detailed structure of the robot arm 100 can refer to the foregoing description and will not be repeated herein.

The heat-dissipating may be disposed at a side of the high-temperature furnace 310, the another process machine, the substrate fork 110, the moving assembly 120 or the vacuum chucks 130 and configured for being moved to above the vacuum chucks 130 when the vacuum chucks 130 are heated and do not suck the glass substrate 200, so as to dissipate heat of the vacuum chucks 130.

Figure 8:
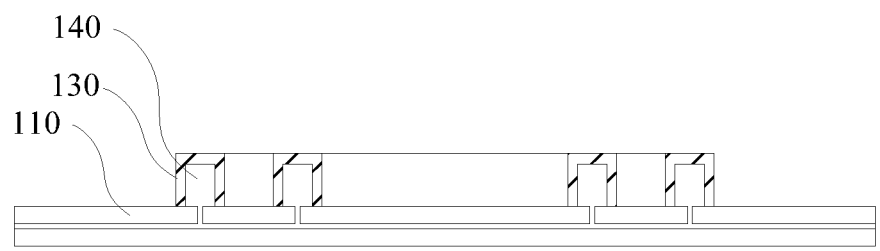
FIG. 8 is a simplified schematic structural view of a robot arm according to another preferred embodiment of the present invention.

Please further refer to FIG. 8, FIG. 8 is a simplified schematic structural view of a robot arm according to another preferred embodiment of the present invention.

In this embodiment, the robot arm 100 includes a substrate fork 110, a moving assembly 120 (refer to FIG. 1) and a vacuum chuck 130.

The substrate fork 110 is configured for taking a glass substrate 200. The moving assembly 120 is connected with the substrate fork 110 and configured for making the substrate fork 110 to be moved in a working space. The vacuum chuck 130 is disposed on the substrate fork 110 and configured for sucking the glass substrate 200. The vacuum chuck 130 is formed with a fluid path 140. The fluid path 140 is contained with a cooling fluid to dissipate heat of the vacuum chuck 130 in time.

In this embodiment, the fluid path 140 is disposed at the interior of the ring-structures of the vacuum chuck 130, i.e., the fluid path 140 runs through the substrate fork 110 and the interior of the ring-structures of the vacuum chuck 130, so as to dissipate heat of the vacuum chuck 130 in time.

Figure 9:
FIG. 9 is a simplified schematic structural view of a robot arm according to still another preferred embodiment of the present invention.

Please further refer to FIG. 9, FIG. 9 is a simplified schematic structural view of a robot arm according to still another embodiment of the present invention.

In this embodiment, the robot arm 100 includes a substrate fork 110, a moving assembly 120 (refer to FIG. 1) and a vacuum chuck 130.

The substrate fork 110 is configured for taking a glass substrate 200. The moving assembly 120 is connected with the substrate fork 110 and configured for making the substrate fork 110 to be moved in a working space. The vacuum chuck 130 is disposed on the substrate fork 110 and configured for sucking the glass substrate 200. The vacuum chuck 130 is equipped with a fluid path 140. The fluid path 140 is contained with a cooling fluid to dissipate heat of the vacuum chuck 130.

In this embodiment, the fluid path 140 is disposed between the ring-structures of the vacuum chuck 130, i.e., the fluid path 140 run through the substrate fork 110 and between two ring-structures of the vacuum chuck 130, so as to dissipate heat of the ring-structures at two sides thereof and thereby dissipate heat of the vacuum chuck 130 in time.

Figure 1:
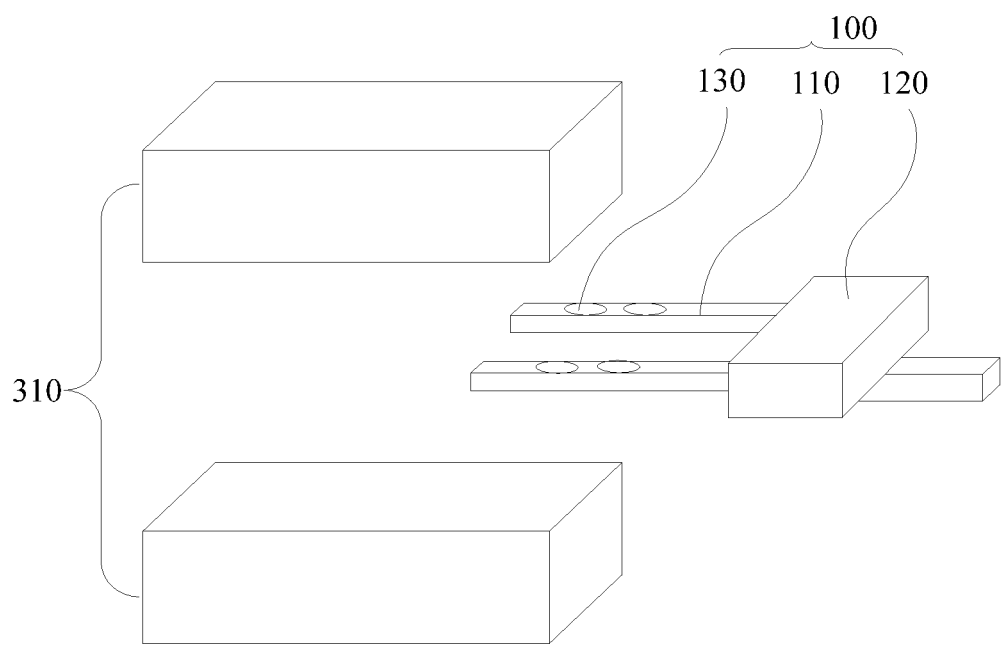
FIG. 1 is a working schematic view of a robot arm in a high-temperature furnace.
Figure 2:
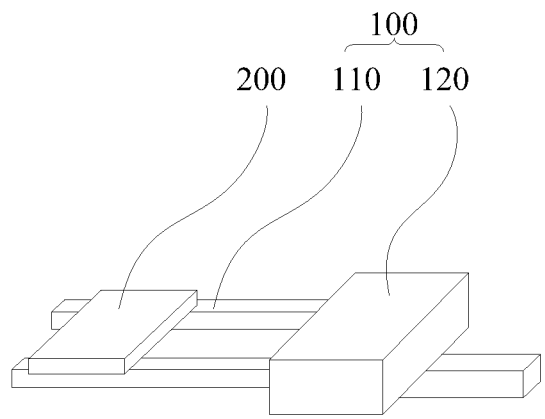
FIG. 2 is a working schematic view of the robot arm transferring a glass substrate.
Figure 3:
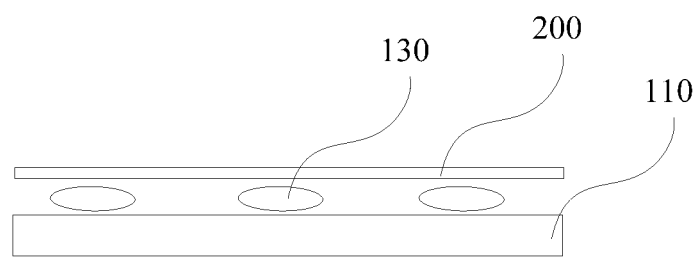
FIG. 3 is a schematic side view of the robot arm as shown in FIG. 2.

Please refer to FIGS. 1, 8 and 9, the present invention also provides a glass substrate transfer system 300. The glass substrate transfer system 300 includes a high-temperature furnace 310 and another process machine (not shown) and further includes the vacuum chuck 130 as shown in FIG. 8 or FIG. 9. The detailed structure of the vacuum chuck 130 can refer to the foregoing description, and thus will not be repeated herein.

In summary, it is easily to be understood by the ordinary skill in the art that the glass substrate transfer system 300 and the robot arm 100 thereof provided by the present invention cool the vacuum chuck(s) 130 in time, which can avoid affecting the product quality caused by the vacuum chuck(s) 130 being overheated, and therefore the product yield is improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A robot arm comprising:
    a substrate fork, configured for taking a glass substrate;
    a moving assembly, connected with the substrate fork and configured for making the substrate fork to be moved in a working space;
    a vacuum chuck, disposed on the substrate fork and configured for sucking the glass substrate, the vacuum chuck is formed with a fluid path, the fluid path is contained with a cooling fluid to dissipate heat of the vacuum chuck; and
    a heat-dissipating assembly, disposed at a side of the substrate fork, the moving assembly or the vacuum chuck are configured for being moved to above of the vacuum chuck to dissipate heat of the vacuum chuck when the vacuum chuck is heated and does not suck the glass substrate;
    wherein the heat-dissipating assembly comprises a gas nozzle, a pipe and a pump sequentially connected in that order, and the one gas nozzle is configured for being moved to above the middle of the vacuum chuck and then spraying ambient-temperature clean gas or low-temperature clean gas onto the vacuum chuck.

2. The robot arm as claimed in claim 1, wherein the vacuum chuck has one ring-structure.

3. The robot arm as claimed in claim 1, wherein the vacuum chuck has concentrically arranged multiple ring-structures.

4. The robot arm as claimed in claim 3, wherein the fluid path is disposed at the interior of the ring-structures.

5. The robot arm as claimed in claim 3, wherein the fluid path is disposed between the ring-structures.

6. The robot arm as claimed in claim 1, wherein there are additional gas nozzles, and the additional gas nozzles are configured for being moved to surround the vacuum chuck and then spraying ambient-temperature clean gas or low-temperature clean gas onto the vacuum chuck.

7. A glass substrate transfer system comprising:
    a high-temperature furnace and process machine;
    a substrate fork, configured for taking a glass substrate;
    a moving assembly, connected with the substrate fork and configured for making the substrate fork to be moved in a working space;
    a vacuum chuck, disposed on the substrate fork and configured for sucking the glass substrate, the vacuum chuck is formed with a fluid path, and the fluid path is contained with a cooling fluid to dissipate heat of the vacuum chuck; and
    a heat-dissipating assembly, disposed at a side of the high-temperature furnace, the process machine, the substrate fork, the moving assembly or the vacuum chuck are configured for being moved to above of the vacuum chuck to dissipate heat of the vacuum chuck when the vacuum chuck is heated and does not suck the glass substrate;
    wherein the heat-dissipating assembly comprises a gas nozzle, a pipe and a pump, the gas nozzle is configured for being moved to above of the middle of the vacuum chuck and spraying ambient-temperature clean gas or low-temperature clean gas onto the vacuum chuck.

8. The glass substrate transfer system as claimed in claim 7, wherein the vacuum chuck has one ring-structure.

9. The glass substrate transfer system as claimed in claim 7, wherein the vacuum chuck has concentrically arranged multiple ring-structures.

10. The glass substrate transfer system as claimed in claim 9, wherein the fluid path is disposed at the interior of the ring-structures.

11. The glass substrate transfer system as claimed in claim 9, wherein the fluid path is disposed between the ring-structures.

12. The glass substrate transfer system as claimed in claim 7, wherein there are additional gas nozzles, and the additional gas nozzles are configured for being moved to surround the vacuum chuck and then spraying ambient-temperature clean gas or low-temperature clean gas onto the vacuum chuck.

* * * * *